United States Patent
Kataoka et al.

(10) Patent No.: US 7,735,713 B2
(45) Date of Patent: Jun. 15, 2010

(54) METHOD FOR MOUNTING CHIP COMPONENT AND CIRCUIT BOARD

(75) Inventors: Naruki Kataoka, Tokyo (JP); Taisuke Ahiko, Nikaho (JP); Akitoshi Yoshii, Tokyo (JP); Akira Goshima, Nikaho (JP); Takashi Aoki, Tokyo (JP); Tomohiro Sogabe, Tokyo (JP)

(73) Assignee: TDK Corporation, Tokyo (JP)

( * ) Notice: Subject to any disclaimer, the term of this patent is extended or adjusted under 35 U.S.C. 154(b) by 239 days.

(21) Appl. No.: 11/562,644

(22) Filed: Nov. 22, 2006

(65) Prior Publication Data

US 2007/0145101 A1 Jun. 28, 2007

(30) Foreign Application Priority Data

Dec. 21, 2005 (JP) ............................. 2005-368797

(51) Int. Cl.
*B23K 31/02* (2006.01)
*H01L 21/44* (2006.01)

(52) U.S. Cl. .................. 228/164; 228/180.22; 228/207; 228/223

(58) Field of Classification Search ................. 228/223, 228/111.5, 207, 208, 262.45, 164, 165, 173.1; 438/612, 615, 616
See application file for complete search history.

(56) References Cited

U.S. PATENT DOCUMENTS

| | | | | |
|---|---|---|---|---|
| 4,997,122 A | * | 3/1991 | Zimmer ...................... | 228/165 |
| 5,108,950 A | * | 4/1992 | Wakabayashi et al. ...... | 438/614 |
| 5,188,280 A | * | 2/1993 | Nakao et al. ............. | 228/123.1 |
| 5,470,787 A | * | 11/1995 | Greer .......................... | 438/614 |
| 5,545,589 A | * | 8/1996 | Tomura et al. .............. | 438/119 |
| 5,550,083 A | * | 8/1996 | Koide et al. ..................... | 438/4 |
| 5,829,668 A | * | 11/1998 | George et al. ............... | 228/254 |
| 6,132,543 A | * | 10/2000 | Mohri et al. ............. | 156/89.12 |
| 6,472,608 B2 | * | 10/2002 | Nakayama ................... | 174/255 |
| 6,527,163 B1 | * | 3/2003 | Eslampour ............... | 228/180.1 |
| 6,660,944 B1 | * | 12/2003 | Murata et al. ............... | 174/261 |
| 6,667,542 B2 | * | 12/2003 | Yamaguchi et al. ......... | 257/668 |
| 6,719,185 B2 | * | 4/2004 | Suzuki ...................... | 228/173.1 |
| 2001/0015285 A1 | * | 8/2001 | Nakayama .................. | 174/250 |
| 2006/0108685 A1 | * | 5/2006 | Tsou et al. .................. | 257/737 |
| 2006/0163725 A1 | * | 7/2006 | Haba et al. .................. | 257/737 |
| 2006/0192285 A1 | * | 8/2006 | Kilger et al. ................ | 257/737 |
| 2008/0197173 A1 | * | 8/2008 | Kitae et al. ............ | 228/180.22 |

FOREIGN PATENT DOCUMENTS

| JP | 55-67190 | | | 5/1980 |
|---|---|---|---|---|
| JP | 63202943 | A | * | 8/1988 |
| JP | 01008647 | A | * | 1/1989 |
| JP | 04037033 | A | * | 2/1992 |
| JP | 9-321425 | | | 12/1997 |
| JP | 11-87431 | | | 3/1999 |

* cited by examiner

*Primary Examiner*—Kiley Stoner
(74) *Attorney, Agent, or Firm*—Oblon, Spivak, McClelland, Maier & Neustadt, L.L.P.

(57) ABSTRACT

A method for mounting a chip component includes the steps of: flattening a solder deposit adhering onto a land terminal of a circuit board; forming grooves on the solder deposit simultaneously with or after flattening the solder deposit; coating the solder deposit with a flux; and placing a chip component on the solder deposit with the flux interposed therebetween.

4 Claims, 10 Drawing Sheets

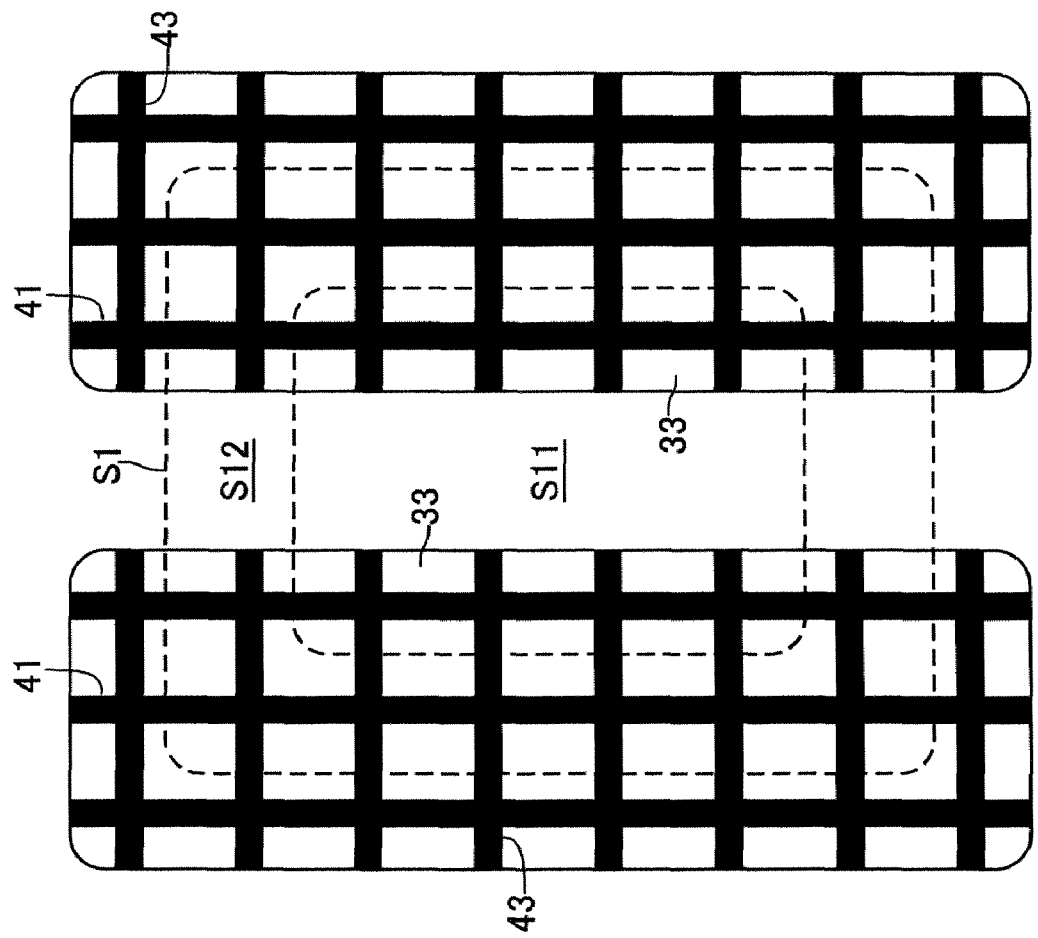
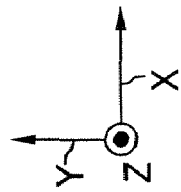
FIG.6

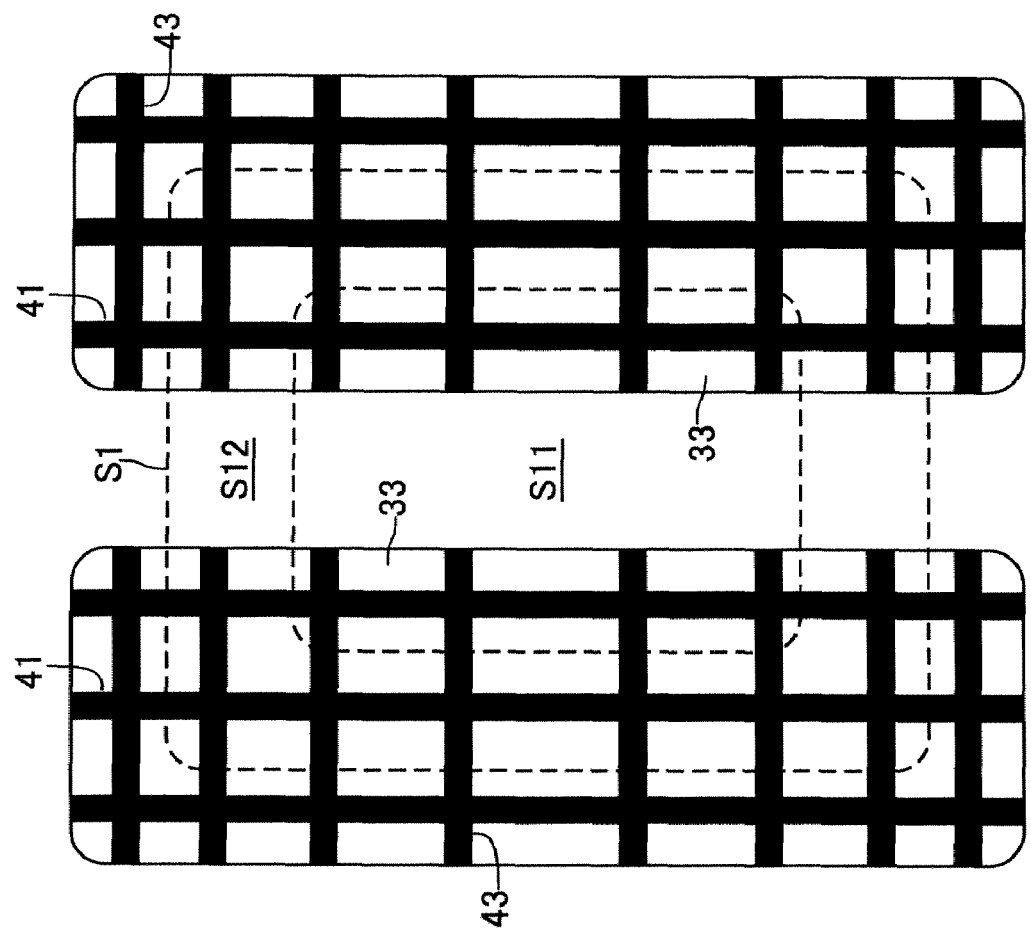
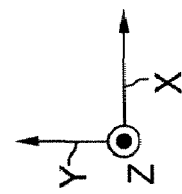
FIG.7

METHOD FOR MOUNTING CHIP COMPONENT AND CIRCUIT BOARD

BACKGROUND OF THE INVENTION

1. Field of the Invention

The present invention relates to a method for mounting a chip component and a circuit board.

2. Description of the Related Art

The following pre-soldering process has been well known as a method for soldering a chip component such as a ceramic capacitor chip and a semiconductor chip on a circuit board.

At first, a solder paste is printed on a land terminal of a circuit board. Then, the solder component contained in the solder paste is melted by passing the circuit board through a reflow furnace without chip components on the solder paste, thereby obtaining a solder deposit adhering to the land terminal.

The solder deposit is then flattened into a suitable form for mounting chip components by using a flattening tool (as disclosed in Japanese Unexamined Patent Application Publication No. H11-87431). After the flattened solder deposit is coated with a flux, chip components are mounted thereon. The circuit board mounted with the chip components is passed through a reflow furnace to melt the solder deposit, soldering the chip components.

The flux plays an important role in preventing oxidation of the solder associated with melting. In the conventional pre-soldering process, the flux has to be applied thick enough to spread over the entire surface of the solder deposit. When the chip components are mounted thereon, accordingly, the thickness of the flux sandwiched between the solder deposit and the chip component remains thick. Hence, there is a possibility that the chip components after passing through the reflow furnace may be lifted up by the effect of the flux, causing displacement of the chip components.

SUMMARY OF THE INVENTION

It is an object of the present invention to provide a method for mounting a chip component and a circuit board which are effective in preventing the displacement of chip components upon mounting.

According to a first aspect of the present invention, there is provided a method for mounting a chip component comprising the steps of:

flattening a solder deposit adhering onto a land terminal of a circuit board;

forming grooves on the solder deposit simultaneously with or after flattening the solder deposit;

coating the solder deposit with a flux; and placing a chip component on the solder deposit with the flux interposed therebetween.

In the chip component mounting method of the present invention, as set forth above, after a solder deposit adhering onto a land terminal of a circuit board is flattened and coated with a flux, a chip component is placed on the solder deposit with the flux interposed therebetween. Accordingly, the solder deposit can be melted by subjecting the circuit board to a well-known heat treatment, such as by passing the circuit board through a reflow furnace, thereby achieving soldering of the chip component.

The chip component mounting method of the present invention is characterized by forming grooves on the solder deposit simultaneously with or after the solder deposit-flattening step and before the flux-coating step. The groove functions as an area capable of retaining a necessary amount of flux on the solder deposit. Therefore, even if the coating amount of the flux on the solder deposit is reduced (i.e., the flux is applied thin), the flux will never lose the function of preventing oxidation of the solder. This enables decreasing the thickness of the flux interposed between the solder deposit and the chip component, thereby preventing the displacement of the chip component by the effect of the flux upon the heat treatment with the reflow furnace or the like.

In addition, the inventors' study has revealed that it is also important to avoid bumping of a solvent in the flux during the heat treatment for preventing the displacement of the chip component.

The grooves formed on the solder deposit according to the present invention increase the contact area of the flux with the solder deposit. Therefore, the solvent contained in the flux can be stably and uniformly evaporated during the heat treatment, avoiding the displacement or Manhattan phenomenon of the chip component due to bumping of the solvent.

Moreover, the grooves function as passages which facilitate the evaporation of the solvent from an area between the solder deposit and the chip component during the heat treatment. Also from this standpoint, the grooves are effective in avoiding the displacement or Manhattan phenomenon of the chip component due to bumping of the solvent.

Preferably, the grooves extend continuously on the solder deposit to reach an edge of the solder deposit.

According to one embodiment, the grooves may have a larger depth in a peripheral portion of a given chip component mounting area on the circuit board than in a central portion of the chip component mounting area surrounded by the peripheral portion.

According to another embodiment, the grooves may have a larger number density in a peripheral portion of a given chip component mounting area on the circuit board than in a central portion of the chip component mounting area surrounded by the peripheral portion.

According to a second aspect of the present invention, there is provided a circuit board comprising:

a substrate;

a land terminal formed on the substrate; and a solder deposit adhering onto the land terminal, the solder deposit having grooves formed thereon.

In the circuit board of the present invention, a land terminal is formed on a substrate of the circuit board and a solder deposit adheres onto the land terminal. Accordingly, a chip component may be mounted on the solder deposit after coating the solder deposit with a flux. Then, the solder deposit can be melted by subjecting the circuit board to a well-known heat treatment, such as by passing the circuit board through a reflow furnace, thereby achieving soldering of the chip component to the land terminal of the circuit board.

The circuit board of the present invention is characterized in that grooves are formed on the solder deposit. The following explanation is similar to the foregoing explanation about the chip component mounting method. The groove functions as an area capable of retaining a necessary amount of flux on the solder deposit. Therefore, even if the coating amount of the flux on the solder deposit is reduced (i.e., the flux is applied thin), the flux will never lose the function of preventing oxidation of the solder. This enables decreasing the thickness of the flux interposed between the solder deposit and the chip component, thereby preventing the displacement of the chip component by the effect of the flux upon the heat treatment with the reflow furnace or the like.

In addition, the grooves formed on the solder deposit increase the contact area of the flux with the solder deposit. Therefore, the solvent contained in the flux can be stably and uniformly evaporated during the heat treatment, avoiding the displacement or Manhattan phenomenon of the chip component due to bumping of the solvent.

Moreover, the grooves function as passages which facilitate the evaporation of the solvent from an area between the solder deposit and the chip component during the heat treatment. Also from this standpoint, the grooves are effective in avoiding the displacement or Manhattan phenomenon of the chip component due to bumping of the solvent.

Preferably, the grooves extend continuously on the solder deposit to reach an edge of the solder deposit.

According to one embodiment, the grooves may have a larger depth in a peripheral portion of a given chip component mounting area on the circuit board than in a central portion of the chip component mounting area surrounded by the peripheral portion.

According to another embodiment, the grooves may have a larger number density in a peripheral portion of a given chip component mounting area on the circuit board than in a central portion of the chip component mounting area surrounded by the peripheral portion.

As has been described hereinabove, the present invention provides a method for mounting a chip component and a circuit board which are effective in preventing the displacement of chip components upon mounting.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 6 is a plan view of the circuit board of FIG. 5, in which a solder deposit is seen in a thickness direction;

FIG. 7 is a plan view of the circuit board of FIG. 5, in which a solder deposit is patterned according to another embodiment of the present invention;

DESCRIPTION OF THE PREFERRED EMBODIMENTS

Figure 1:
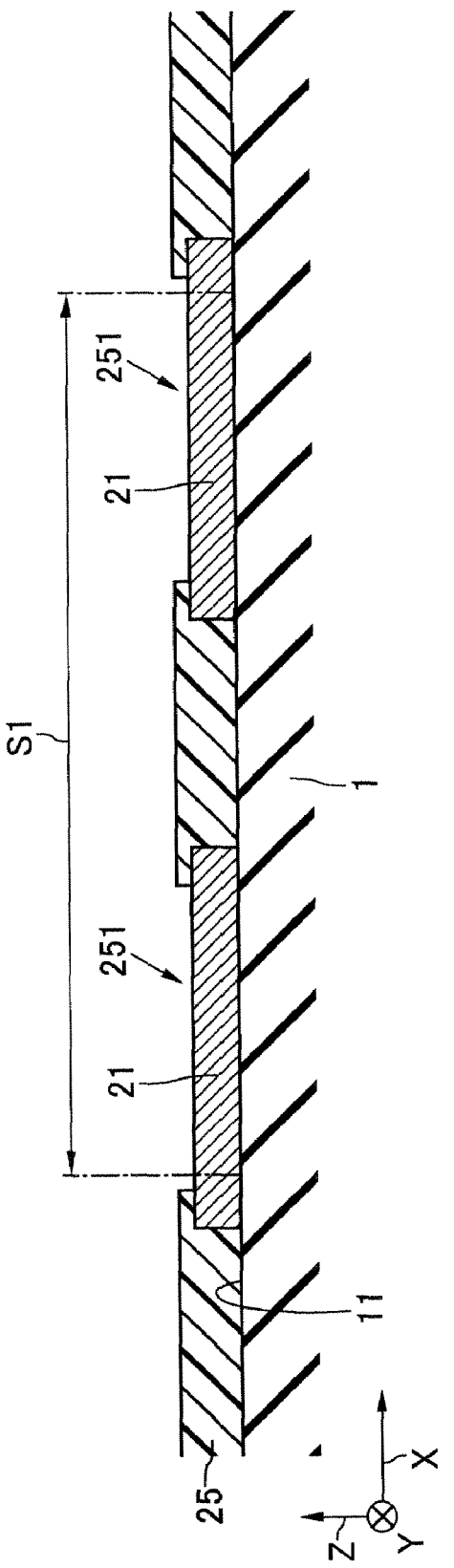
FIG. 1 is a sectional view showing a circuit board to be mounted with a chip component by a chip component mounting method according to one embodiment of the present invention.

FIG. 1 shows a section of a circuit board 1. The circuit board 1 is formed from an electrical insulating material such as an organic resin into a plate form having a given thickness in a thickness direction Z. The circuit board 1 has a substrate 11 with a given area S1 to be mounted with a chip component (hereinafter referred to as "chip component mounting area").

The illustrated chip component mounting area S1 is intended for a ceramic capacitor chip and in a rectangular shape defined by length and width directions X and Y.

The circuit board 1 is provided with land terminals 21 and a resist film 25. The land terminals 21 are formed from a conductive metal material such as Cu and disposed on the substrate 11 of the circuit board 1 at opposite sides of the chip component mounting area S1 in the length direction X.

The resist film 25 is deposited on the substrate 11 of the circuit board 1 around the land terminals 21. More specifically, the resist film 25 has openings 251 through which the land terminals 21 are exposed externally. Preferably, the edge of the opening 251 of the resist film 25 lies on the land terminal 21.

Figure 2:
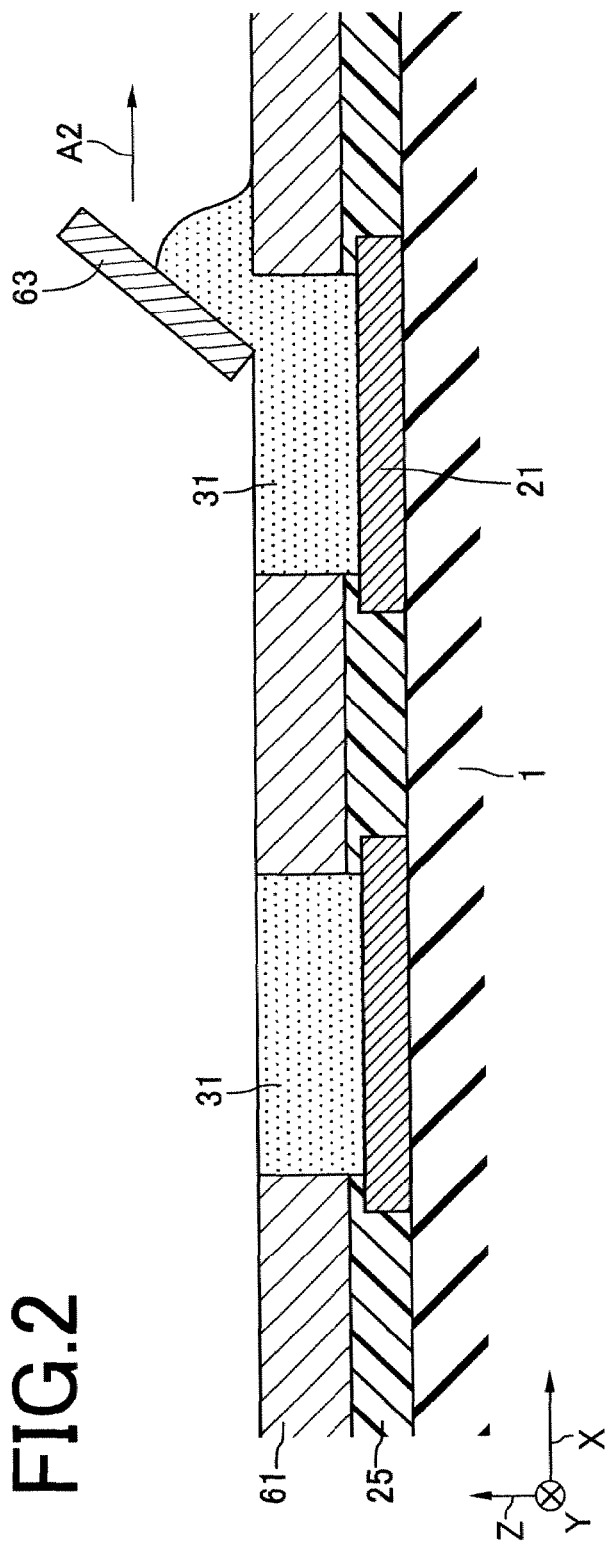
FIG. 2 is a sectional view schematically showing a step of the chip component mounting method according to one embodiment of the present invention.

Next, as shown in FIG. 2, a solder paste 31 is printed on the land terminals 21. Concretely, a mask 61 having openings is prepared and placed with its openings coinciding with the openings 251 (see FIG. 1) of the resist film 25. Then, the solder paste 31 is put on the mask 61 and a squeegee 63 is slid across the mask 61 in the direction of an arrow A2.

The solder paste 31 may be formed by mixing a solder component with a flux. For example, the solder component may be of a Sn/Ag/Cu type. The flux carries not only the function of ensuring fluidity of the solder paste during printing but also the function of preventing oxidation of the solder during a heat treatment described below.

After the step shown in FIG. 2, the circuit board 1 is subjected to a heat treatment with a reflow furnace or the like. The heat treatment is performed without chip components on the solder paste 31.

Figure 3:
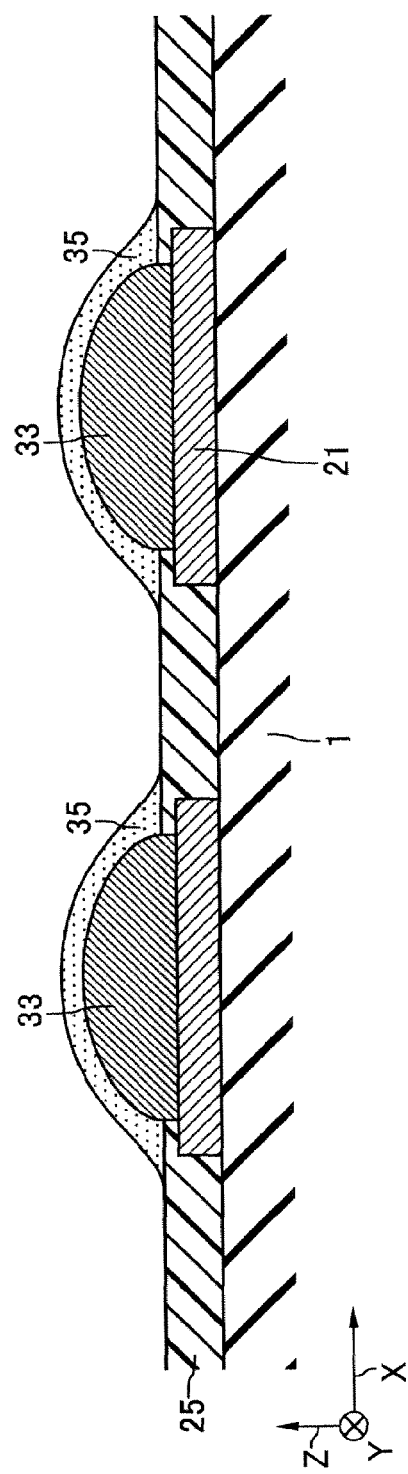
FIG. 3 is a sectional view schematically showing a step after the step of FIG. 2.

With this heat treatment, the solder component contained in the solder paste 31 is made into an alloy, whereby solder deposits 33 adhering to the land terminals 21 can be obtained as shown in FIG. 3. The solder deposit 33 is rounded or peaked as seen in the section parallel to the thickness direction Z. A flux 35, which is separated from the solder component during the heat treatment, adheres to the surface of the solder deposit 33.

Thereafter, the flux 35 adhering to the solder deposit 33 is dissolved and removed from the surface of the solder deposit 33 by a cleaning solution or the like.

Figure 4:
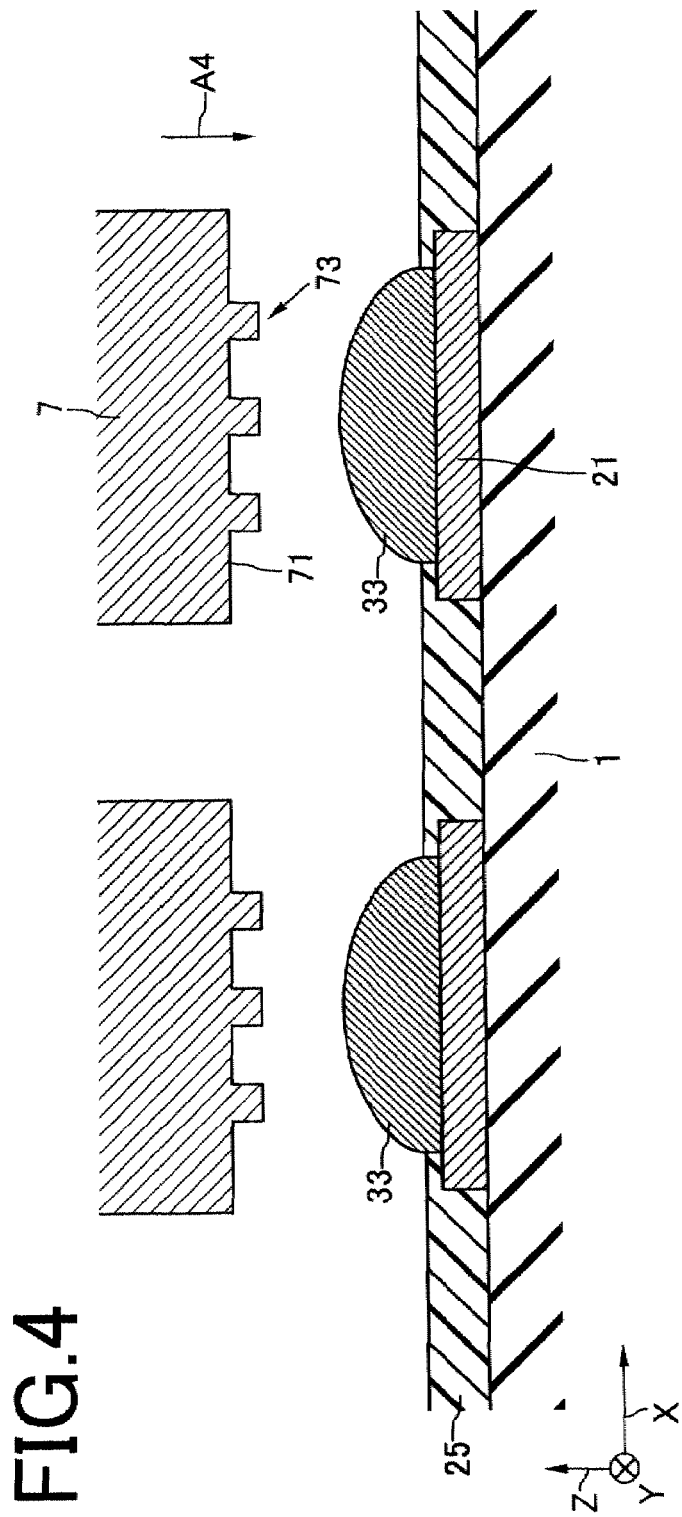
FIG. 4 is a sectional view schematically showing a step after the step of FIG. 3.

Next, flattening of the solder deposit 33 is performed as shown in FIG. 4. As used herein, the term "flattening" refers to a process of deforming the solder deposit 33 into a suitable form for mounting a chip component thereon, i.e., into a generally flat form as seen in a section parallel to the thickness direction Z. In the illustrated chip component mounting method according to one embodiment of the present invention, a surface 71 of a flattening tool 7 is applied to the surface of the solder deposit 33. As indicated by an arrow A4, moreover, a pressure is applied to the solder deposit 33 with the surface 71 of the flattening tool 7, crushing the solder deposit 33.

Figure 5:
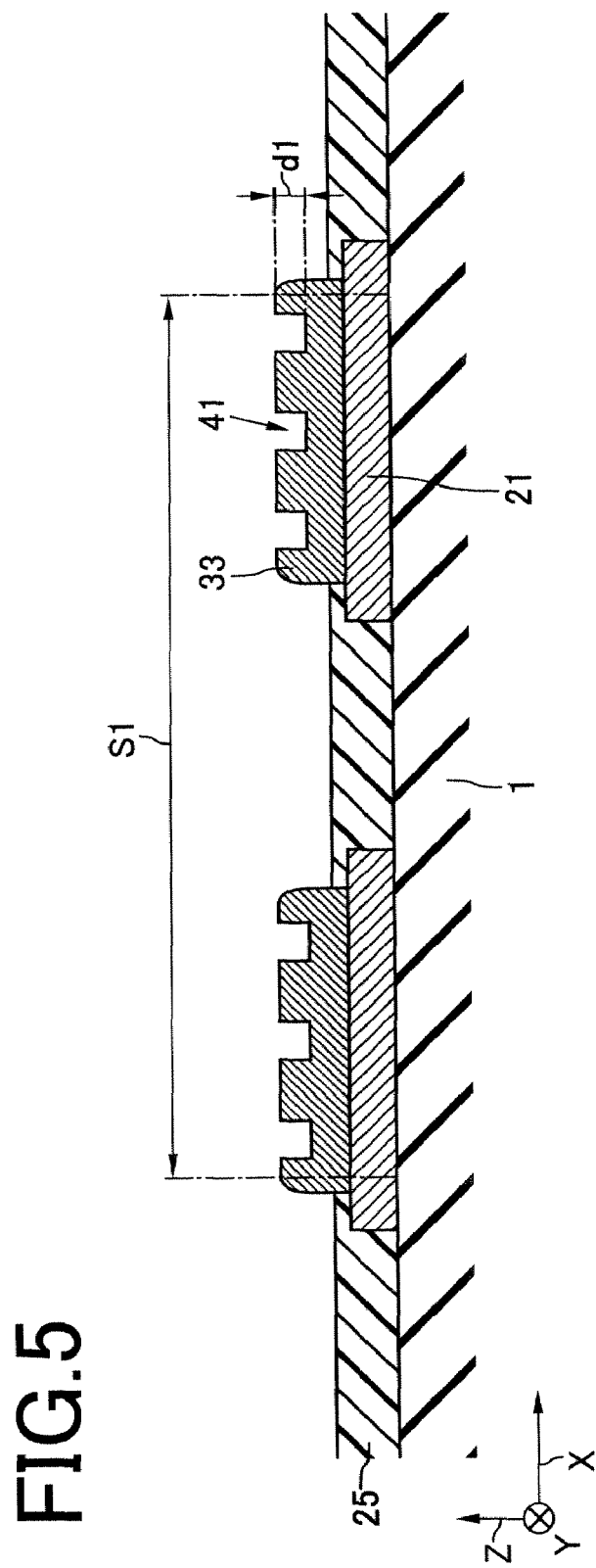
FIG. 5 is a sectional view showing the circuit board after the step of FIG. 4.

FIG. 5 is a sectional view showing the circuit board 1 after the step shown in FIG. 4, and FIG. 6 is a plan view of the circuit board 1 shown in FIG. 5, in which the surface of the solder deposit 33 is seen in the thickness direction Z. The flattened solder deposit 33 shown in FIGS. 5 and 6 can be obtained by the flattening process described with reference to FIG. 4. For example, the flattened solder deposit 33 has a length (i.e., size in the length direction X) of 200 μm, a width (i.e., size in the width direction Y) of 1000 μm, a thickness (i.e., size in the thickness direction X) of 20 μm.

In the illustrated chip component mounting method according to one embodiment of the present invention, grooves 41 and 43 (see FIGS. 5 and 6) are formed on the solder deposit 33 simultaneously with flattening the solder deposit 33. Concretely, the surface 71 of the flattening tool 7 is provided with ribs 73 (see FIG. 4) for forming the grooves 41 and 43 simultaneously with the flattening step.

Referring to FIG. 6, the grooves 41 extend on the solder deposit 33 continuously in the width direction Y to reach opposite edges of the solder deposit 33 in the width direction Y. The grooves 43 also extend on the solder deposit 33 continuously in the length direction X to reach opposite edges of the solder deposit 33 in the length direction X. As regards the size of the grooves 41 and 43, the width may be set within the range of 5 μm to 180 μm, for example, at 10 μm; the depth may be set within the range of 5 μm to 20 μm, for example, at 10 μm.

As regards the arrangement of the grooves 41 and 43, on the other hand, the grooves 41 and 43 may be arranged in a lattice along the length and width directions X and Y on the solder deposit 33. Concretely, the grooves 41 extend in the width direction Y and are spaced apart from one another in the length direction X. The grooves 43 extend in the length direction X and are spaced apart from one another in the width direction Y. The grooves 43 intersect with the grooves 41.

These lattice-like grooves 41 and 43 may be formed by using the ribs 73 arranged in a lattice on the surface 71 of the flattening tool 7.

Referring again to FIG. 6, the chip component mounting area S1 has a central portion S11 and a peripheral portion S12 surrounding the central portion S11. According to one embodiment, the groove 41 increases in depth d1 (see FIG. 5) as extending in the width direction Y from the central portion S11 to the peripheral portion S12 of the chip component mounting area S1. The depth d1 of the groove 41 may increase stepwise rather than continuously. For example, the depth d1 of the groove 41 may be set at a first value in the central portion S11 of the chip component mounting area S1 and at a second value larger than the first value in the peripheral portion S12 of the chip component mounting area S1. The depth of the groove 43 may be varied in the same manner as extending in the length direction X.

According to another embodiment, as shown in FIG. 7, the grooves 43 are spaced at different distances in the width direction Y so as to increase in number density from the central portion S11 to the peripheral portion S12 of the chip component mounting area S1. The number density of the grooves 43 may increase stepwise rather than continuously. In addition, or alternatively, the number density of the grooves 41 may be similarly varied.

In the illustrated chip component mounting method according to one embodiment of the present invention, forming the grooves 41 and 43 on the solder deposit 33 is performed simultaneously with flattening the solder deposit 33 (see FIGS. 4 and 5), but forming the grooves on the solder deposit may be performed after flattening the solder deposit.

Figure 8:
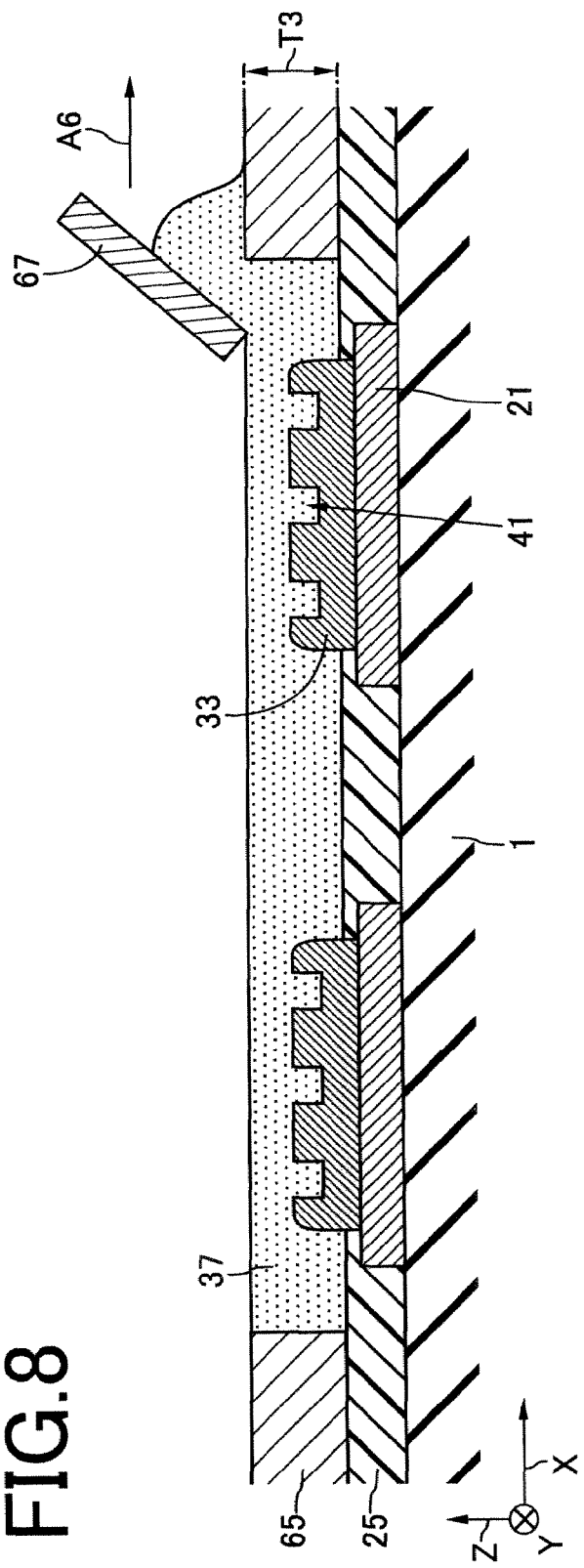
FIG. 8 is a sectional view schematically showing a step after the step of FIG. 4.

Next, the solder deposits 33 are coated with a flux 37, as shown in FIG. 8. Concretely, a mask 65 having an opening is prepared and placed with the solder deposits 33 positioned within the opening. Then, the flux 37 is put on the mask 65 and a squeegee 67 is slid across the mask 65 in the direction of an arrow A6.

The composition of the flux 37 as used may be identical to or different from the composition of the flux contained in the foregoing solder paste 31 (see FIG. 2). The flux 37 carries not only the function of retaining a chip component on the solder deposit 33 by its adhesive power but also the function of preventing oxidation of the solder during a subsequent heat treatment. For example, the flux 37 may be a water-soluble flux.

It should be noted that the coating amount of the flux 37 on the solder deposit 33 may be controlled by a thickness T3 of the mask 65. For example, the coating amount of the flux 37 can be reduced (i.e., the flux 37 can be applied thin) by decreasing the thickness T3 of the mask 65.

Figure 9:
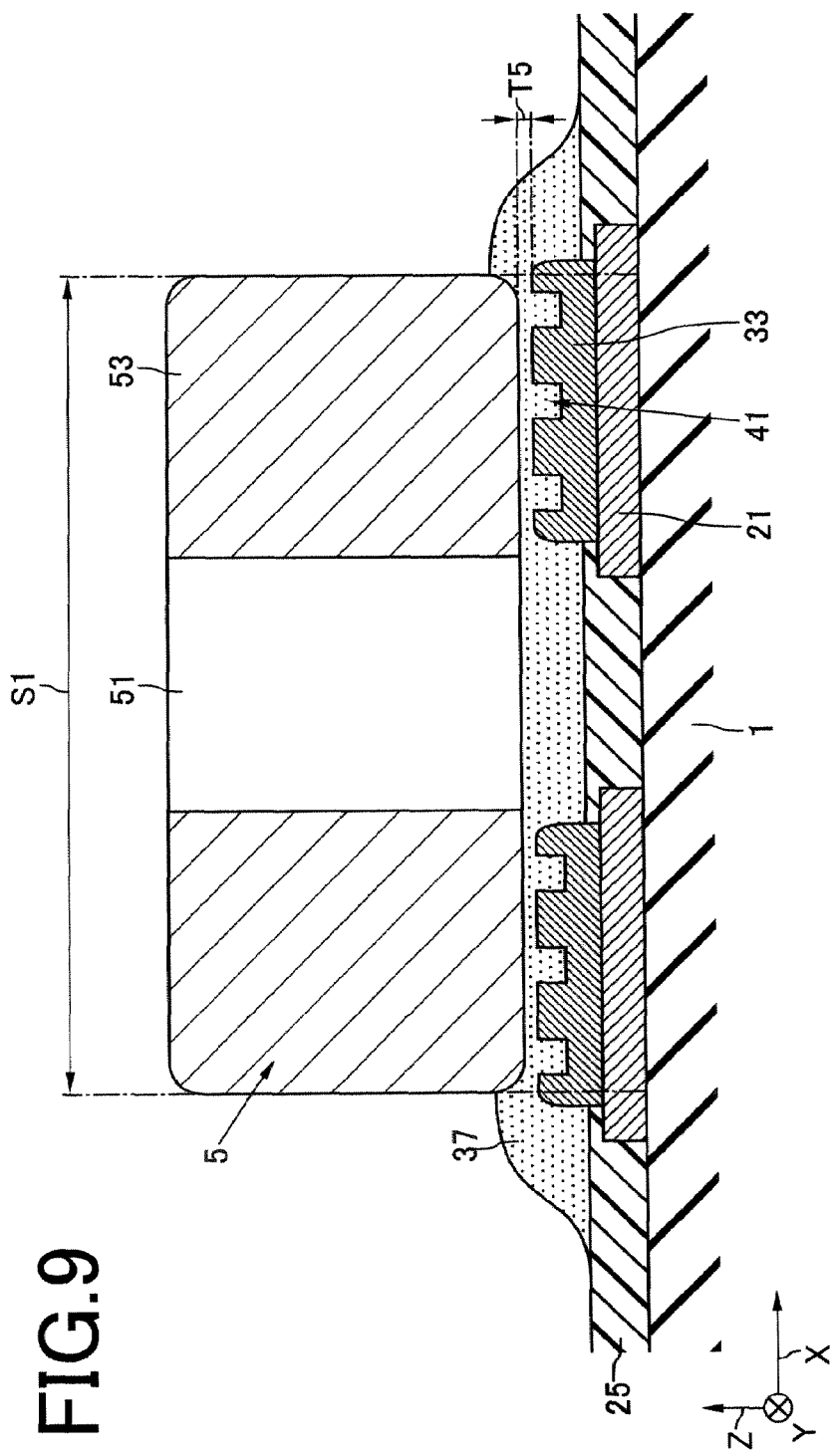
FIG. 9 is a sectional view schematically showing a step after the step of FIG. 8.

Next, as shown in FIG. 9, a chip component 5 is placed on the circuit board 1 to coincide with the chip component mounting area S1 as seen in a plane perpendicular to the thickness direction Z. Concretely, the chip component 5 is placed on the solder deposit 33 with the flux 37 interposed therebetween. The chip component 5 is retained above the solder deposit 33 and the resist film 25 by the adhesive power of the flux 37.

The illustrated chip component 5 comprises a ceramic substrate 51 and terminal electrodes 53 formed on opposite side faces of the ceramic substrate 51 extending parallel to a longitudinal direction of the ceramic substrate 51. The chip component 5 is placed on the circuit board 1 with the longitudinal direction of the ceramic substrate 51 coinciding with the width direction Y of the circuit board 1.

Figure 10:
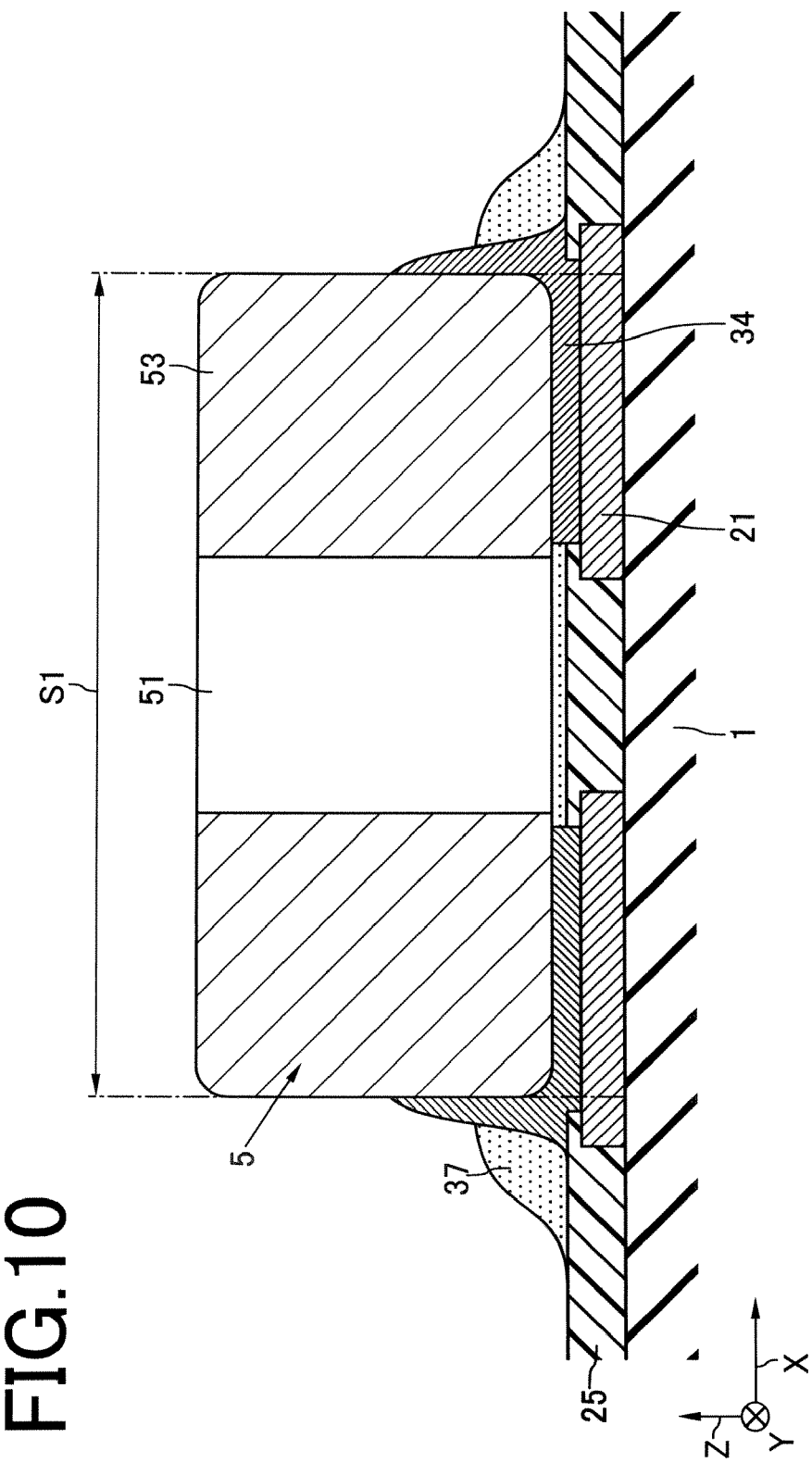
FIG. 10 is a sectional view showing a state where a chip component is soldered to the circuit board.

After the step shown in FIG. 9, the circuit board 1 mounted with the chip component 5 is subjected to a heat treatment with a reflow furnace or the like. This melts the solder deposit 33, joining the terminal electrodes 53 of the chip component 5 to the land terminals 21 through solders 34, as shown in FIG. 10.

In the above described chip component mounting method, the solder deposit 33 adhering to the land terminal 21 of the circuit board 1 is flattened, as shown in FIGS. 4 and 5. Then, the flattened solder deposit 33 is coated with the flux 37, as shown in FIG. 8. Thereafter, the chip component 5 is placed on the solder deposit 33 with the flux 37 interposed therebetween, as shown in FIG. 9. The solder deposit 33 is melted by subjecting the circuit board 1 to a heat treatment with a reflow furnace or the like, thereby soldering the chip component 5, as shown in FIG. 10.

As described with reference to FIGS. 4 and 5, furthermore, the method includes forming the grooves 41 and 43 on the solder deposit 33 in addition to flattening the solder deposit 33. When the circuit board 1 is subjected to a heat treatment with the chip component 5 mounted thereon (see FIG. 9), the grooves 41 and 43 function as an area capable of retaining a necessary amount of flux 37 on the solder deposit 33. Therefore, even if the coating amount of the flux 37 on the solder deposit 33 is reduced (i.e., the flux 37 is applied thin) by decreasing the thickness T3 of the mask 65, as shown in FIG. 8, the flux 37 will never lose the function of preventing oxidation of the solder.

This enables decreasing the thickness T5 of the flux 37 interposed between the solder deposit 33 and the chip component 5 (see FIG. 9), thereby preventing the displacement of the chip component 5 by the effect of the flux 37 upon the subsequent heat treatment.

In addition, the grooves 41 and 43 formed on the solder deposit 33 increase the contact area of the flux 37 with the solder deposit 33 in a state where the chip component 5 is mounted thereon (see FIG. 9). Therefore, the solvent contained in the flux 37 can be stably and uniformly evaporated during the heat treatment, avoiding the displacement or Manhattan phenomenon of the chip component 5 due to bumping of the solvent.

Moreover, the grooves 41 and 43 function as passages which facilitate the evaporation of the solvent from an area between the solder deposit 33 and the chip component 5 during the heat treatment (see FIG. 9). Also from this standpoint, the grooves 41 and 43 are effective in avoiding the displacement or Manhattan phenomenon of the chip component 5 due to bumping of the solvent.

Moreover, as described with reference to FIG. 6, the grooves 41 extend continuously on the solder deposit 33 to reach the edge of the solder deposit 33. These grooves 41 are suitable as passages which facilitate the ejection of excess flux 37 from an area between the solder deposit 33 and the chip component 5 (see FIG. 9). They are also suitable as passages which facilitate the evaporation of the solvent in the flux 37 during the heat treatment. Accordingly, they are effective in preventing the displacement or Manhattan phenomenon of the chip component 5. The same holds true for the grooves 43.

In addition, the inventors' study has revealed that the power to cause the displacement or Manhattan phenomenon of the chip component 5 increases in a direction from the central portion S11 to the peripheral portion S12 of the chip component mounting area S1 (see FIG. 6).

According to one embodiment, the grooves 41, which extend in the width direction Y, may have a larger depth d1 (see FIG. 5) in the peripheral portion S12 than in the central portion S11 of the chip component mounting area S1. With this configuration, the flux 37 may be minimized in the central portion S11 while keeping much flux 37 in the peripheral portion S12, thereby inhibiting the displacement or Manhattan phenomenon of the chip component 5 due to rapid volatilization of the flux. The same holds true for the grooves 43 extending in the length direction X.

According to another embodiment, the grooves 43, which extend in the length direction X, may have a larger number density in the peripheral portion S12 than in the central portion S11 of the chip component mounting area S1, as shown in FIG. 7. Also with this configuration, the flux 37 may be minimized in the central portion S11 while keeping much flux 37 in the peripheral portion S12, thereby inhibiting the displacement or Manhattan phenomenon of the chip component 5 due to rapid volatilization of the flux. The same holds true for the grooves 41 extending in the width direction Y.

In addition, the inventors' study has revealed that the displacement or Manhattan phenomenon of the chip component is apt to occur in the chip component structure with the terminal electrodes 53 formed on the opposite side faces of the ceramic substrate 51 extending parallel to the longitudinal direction of the ceramic substrate 51 (see FIG. 9) because the distance between the opposite terminal electrodes is smaller than in another chip component structure with the terminal electrodes formed on the opposite end faces of the ceramic substrate extending perpendicular to the longitudinal direction of the ceramic substrate. Therefore, the grooves 41 and 43 formed on the solder deposit 33 are particularly effective in the chip component structure shown in FIG. 9.

While the present invention has been particularly shown and described with reference to embodiments thereof, it will be understood by those skilled in the art that various changes in form and detail may be made therein without departing from the spirit, scope and teaching of the invention.

What is claimed is:

1. A method for mounting a chip component comprising:
   forming a flattened surface of a solder deposit adhering onto a land terminal of a circuit board;
   forming grooves recessed from said flattened surface simultaneously with or after forming said flattened surface;
   coating said solder deposit with a flux; and
   placing a chip component on said solder deposit with said flux interposed therebetween,
   wherein said grooves are arranged in a lattice along a length direction X and width direction Y and extend continuously on said solder deposit to reach edges of said solder deposit.

2. The method of claim 1, wherein said grooves have a larger depth in a peripheral portion of a given chip component mounting area on said circuit board than in a central portion of said chip component mounting area surrounded by said peripheral portion.

3. The method of claim 1, wherein said grooves have a larger number density in a peripheral portion of a given chip component mounting area on said circuit board than in a central portion of said chip component mounting area surrounded by said peripheral portion.

4. The method of claim 1, wherein said chip component comprises a ceramic substrate and terminal electrodes formed on side faces of said ceramic substrate extending parallel to a longitudinal direction of said ceramic substrate.

* * * * *